US012308202B2

United States Patent
Maekawa et al.

(10) Patent No.: US 12,308,202 B2
(45) Date of Patent: May 20, 2025

(54) MULTI-ELECTRON BEAM INSPECTION APPARATUS, MULTIPOLE ARRAY CONTROL METHOD, AND MULTI-ELECTRON BEAM INSPECTION METHOD

(71) Applicant: NuFlare Technology, Inc., Yokohama (JP)

(72) Inventors: Yuichi Maekawa, Yokohama (JP); Atsushi Ando, Edogawa-ku (JP)

(73) Assignee: NuFlare Technology, Inc., Yokohama (JP)

( * ) Notice: Subject to any disclaimer, the term of this patent is extended or adjusted under 35 U.S.C. 154(b) by 432 days.

(21) Appl. No.: 17/817,474

(22) Filed: Aug. 4, 2022

(65) Prior Publication Data
US 2023/0091222 A1 Mar. 23, 2023

(30) Foreign Application Priority Data
Sep. 16, 2021 (JP) .................................. 2021-150890

(51) Int. Cl.
*H01J 37/141* (2006.01)
*H01J 37/12* (2006.01)
(Continued)

(52) U.S. Cl.
CPC ............ *H01J 37/141* (2013.01); *H01J 37/12* (2013.01); *H01J 37/1474* (2013.01);
(Continued)

(58) Field of Classification Search
CPC .......... H01J 37/00; H01J 37/02; H01J 37/141; H01J 37/12; H01J 37/1474; H01J 37/153;
(Continued)

(56) References Cited

U.S. PATENT DOCUMENTS

| | | | |
|---|---|---|---|
| 2019/0355547 A1 | 11/2019 | Ando et al. | |
| 2020/0027687 A1* | 1/2020 | Cook | H01J 37/244 |
| 2020/0395189 A1* | 12/2020 | Inoue | H01J 37/09 |

FOREIGN PATENT DOCUMENTS

| | | |
|---|---|---|
| JP | 10-2004-0072024 A | 8/2004 |
| JP | 2019-200983 A | 11/2019 |

(Continued)

*Primary Examiner* — Jason L McCormack
(74) *Attorney, Agent, or Firm* — Oblon, McClelland, Maier & Neustadt, L.L.P.

(57) ABSTRACT

A multi-electron beam inspection apparatus includes first sample hold circuits, each configured to include a capacitor and a switch arranged for each of electrodes of each of a plurality of multipoles, and to hold, using the capacitor and the switch, a potential to be applied to the each of the electrodes, power sources configured to apply potentials to the plurality of first sample hold circuits, a control circuit configured to control the plurality of first sample hold circuits such that the plurality of potentials having been applied to the plurality of first sample hold circuits are held, in synchronization with swinging back of the collective beam deflection by the objective deflector, by a plurality of second sample hold circuits selected from the plurality of first sample hold circuits, and a detector configured to detect multiple secondary electron beams emitted because the substrate is irradiated with the multiple primary electron beams.

11 Claims, 15 Drawing Sheets

(51) Int. Cl.
    *H01J 37/147*     (2006.01)
    *H01J 37/153*     (2006.01)
    *H01J 37/20*     (2006.01)
    *H01J 37/244*     (2006.01)
    *H01J 37/26*     (2006.01)
    *H01J 37/28*     (2006.01)

(52) U.S. Cl.
    CPC ............ *H01J 37/153* (2013.01); *H01J 37/20* (2013.01); *H01J 37/244* (2013.01); *H01J 37/265* (2013.01); *H01J 37/28* (2013.01); *H01J 2237/1532* (2013.01); *H01J 2237/1534* (2013.01); *H01J 2237/2007* (2013.01); *H01J 2237/2817* (2013.01)

(58) Field of Classification Search
    CPC ........ H01J 37/20; H01J 37/244; H01J 37/265; H01J 37/26; H01J 37/28; H01J 2237/1532; H01J 2237/1534; H01J 2237/2007; H01J 2237/2817; H01J 2237/1504
    USPC ................................. 250/306, 307, 310, 311
    See application file for complete search history.

(56) References Cited

FOREIGN PATENT DOCUMENTS

JP      10-2020-0143275 A      12/2020
JP      10-2021-0096205 A      8/2021

\* cited by examiner

FIG.5A
FIG.5B
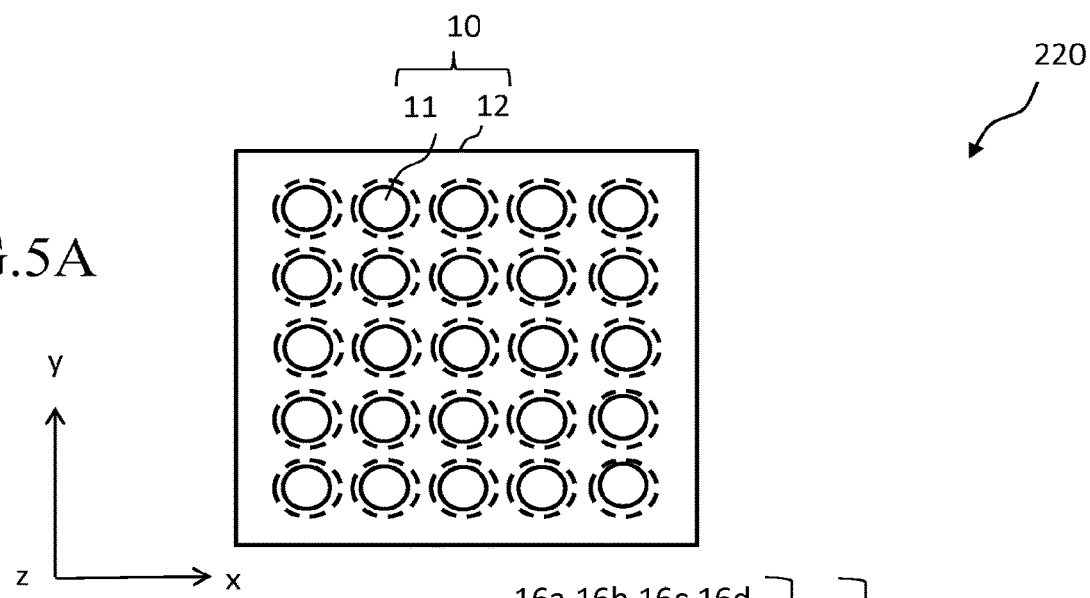
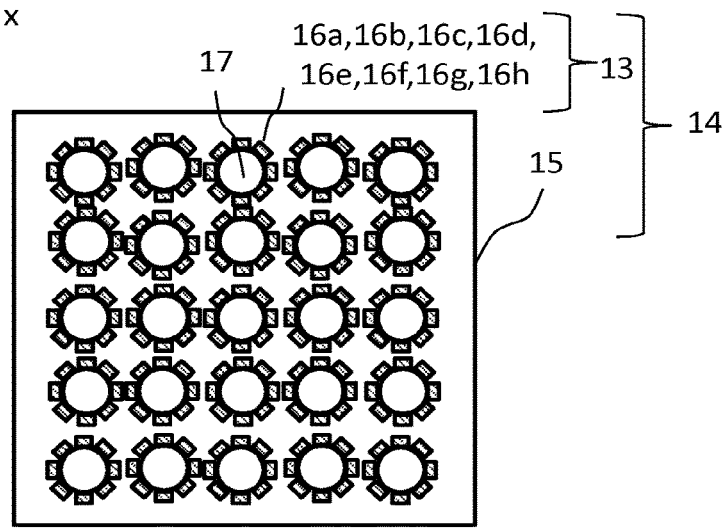

MULTI-ELECTRON BEAM INSPECTION APPARATUS, MULTIPOLE ARRAY CONTROL METHOD, AND MULTI-ELECTRON BEAM INSPECTION METHOD

CROSS-REFERENCE TO RELATED APPLICATION

This application is based upon and claims the benefit of priority from prior Japanese Patent Application No. 2021-150890 filed on Sep. 16, 2021 in Japan, the entire contents of which are incorporated herein by reference.

BACKGROUND OF THE INVENTION

Field of the Invention

Embodiments of the present invention relate to a multi-electron beam inspection apparatus, a multipole array control method, and a multi-electron beam inspection method. For example, it relates to a multipole array for correcting an aberration of multiple electron beams, and to an apparatus provided with a multipole array and applying multiple electron beams.

Description of Related Art

With recent progress in high integration and large capacity of the LSI (Large Scale Integrated circuits), the line width (critical dimension) required for circuits of semiconductor elements is becoming increasingly narrower. Since LSI manufacturing requires an enormous production cost, it is essential to improve the yield. Meanwhile, as typified by 1 gigabit DRAMs (Dynamic Random Access Memories), the size of patterns that make up the LSI is reduced from the order of submicrons to nanometers. Also, in recent years, with miniaturization of dimensions of LSI patterns formed on a semiconductor wafer, dimensions to be detected as a pattern defect have become extremely small. Therefore, the pattern inspection apparatus for inspecting defects of ultrafine patterns exposed/transferred onto a semiconductor wafer needs to be highly accurate. Further, one of major factors that decrease the yield of the LSI manufacturing is due to pattern defects on a mask for exposing/transferring an ultrafine pattern onto the semiconductor wafer by the photolithography technology. Therefore, the pattern inspection apparatus for inspecting defects on an exposure transfer mask used in manufacturing LSI also needs to be highly accurate.

The inspection apparatus acquires a pattern image by, for example, irradiating an inspection target substrate with multiple electron beams and detecting a secondary electron corresponding to each beam emitted from the inspection target substrate. As an inspection method, there is known a method of comparing a measured image acquired by imaging a pattern formed on a substrate with design data or with another measured image acquired by imaging an identical pattern on the same substrate. For example, as a pattern inspection method, there is "die-to-die inspection" or "die-to-database inspection". Specifically, the "die-to-die inspection" method compares data of measured images acquired by imaging identical patterns at different positions on the same substrate. The "die-to-database inspection" method generates, based on pattern design data, design image data (reference image), and compares it with a measured image being measured data acquired by imaging a pattern. Acquired images are transmitted as measured data to a comparison circuit. After performing alignment between the images, the comparison circuit compares the measured data with reference data according to an appropriate algorithm, and determines that there is a pattern defect if the compared data do not match each other.

In an electron optical system using multiple beams, aberration such as a field curvature, an off-axis astigmatism, or a distortion (distortion aberration) may occur. With respect to an inspection apparatus using electron beams, it is necessary to acquire a highly accurate image in order to perform inspection. In order to correct such an aberration, the trajectory of each beam of the multiple beams needs to be individually corrected. For example, there is disclosed that multipole lenses each independently for each beam are arranged in an array (e.g., refer to Japanese Patent Application Laid-open (JP-A) No. 2019-200983).

For individually correcting each beam by using a multipole lens, controlling should be individually performed per beam and per electrode. Therefore, needed are power sources whose number is the same as that obtained by multiplying the number of beams by the number of electrodes of the multipole. With increase in the number of the beams, the number of the power sources also increases, which causes a problem that it is difficult to mount them.

BRIEF SUMMARY OF THE INVENTION

According to one aspect of the present invention, a multi-electron beam inspection apparatus includes a stage on which a substrate is to be mounted, an emission source configured to emit multiple primary electron beams, a multipole array configured to include a plurality of multipoles each of which is arranged at a position, where a corresponding beam of the multiple primary electron beams passes through, to surround the corresponding beam, an objective deflector configured to scan the substrate with the multiple primary electron beams by performing a collective beam deflection of the multiple primary electron beams having passed through the multipole array, a plurality of first sample hold circuits, each configured to include a capacitor and a switch arranged for each of electrodes of each of the plurality of multipoles, and to hold, using the capacitor and the switch, a potential to be applied to the each of the electrodes, a plurality of power sources configured to apply a plurality of potentials to the plurality of first sample hold circuits, a control circuit configured to control the plurality of first sample hold circuits such that the plurality of potentials having been applied to the plurality of first sample hold circuits are held, in synchronization with swinging back of the collective beam deflection by the objective deflector, by a plurality of second sample hold circuits selected from the plurality of first sample hold circuits, and a detector configured to detect multiple secondary electron beams emitted because the substrate is irradiated with the multiple primary electron beams.

According to another aspect of the present invention, a multipole array control method includes applying a plurality of potentials to a plurality of first sample hold circuits each of which holds, using a capacitor and a switch, a potential to be applied to an electrode; holding, in synchronization with swinging back of a collective beam deflection of multiple primary electron beams by an objective deflector which scans a substrate with the multiple primary electron beams by the collective beam deflection of the multiple primary electron beams, the plurality of potentials having been applied to the plurality of first sample hold circuits, by a plurality of second sample hold circuits selected from the plurality of first sample hold circuits; and applying the plurality of potentials having been held by the plurality of second sample hold circuits to a plurality of electrodes, which are connected to the plurality of second sample hold circuits, of a plurality of multipoles each of which is arranged at a position, where a corresponding beam of the multiple primary electron beams passes through, to surround the corresponding beam.

According to yet another aspect of the present invention, a multi-electron beam inspection method includes emitting multiple primary electron beams; scanning a substrate placed on a stage with the multiple primary electron beams by using an objective deflector which performs a collective beam deflection of the multiple primary electron beams; applying a plurality of potentials to a plurality of first sample hold circuits each of which holds, using a capacitor and a switch, a potential to be applied to an electrode; holding, in synchronization with swinging back of the collective beam deflection of the multiple primary electron beams by the objective deflector, the plurality of potentials having been applied to the plurality of first sample hold circuits, by a plurality of second sample hold circuits selected from the plurality of first sample hold circuits; applying the plurality of potentials having been held by the plurality of second sample hold circuits to a plurality of electrodes, which are connected to the plurality of second sample hold circuits, of a plurality of multipoles each of which is arranged at a position, where a corresponding beam of the multiple primary electron beams passes through, to surround the corresponding beam; individually correcting an aberration of each beam of the multiple primary electron beams by a multipole array including the plurality of multipoles; detecting multiple secondary electron beams emitted because the substrate is irradiated with the multiple primary electron beams; and comparing a detection image based on a detected detection signal with a reference image, to output a result.

BRIEF DESCRIPTION OF THE DRAWINGS

FIGS. 5A and 5B are top views showing examples of a configuration of each electrode substrate of an aberration corrector according to the first embodiment;

DETAILED DESCRIPTION OF THE INVENTION

In the following, embodiments of the present invention provide an apparatus and method that can reduce the number of power sources used for a multipole array.

Further, embodiments below describe a multi-electron beam inspection apparatus, as an example of a multi-electron beam irradiation apparatus. The multi-electron beam irradiation apparatus is not limited to the inspection apparatus, and may be an apparatus, such as a writing apparatus, which applies multiple electron beams through an electron optical system, for example.

First Embodiment

Figure 1:
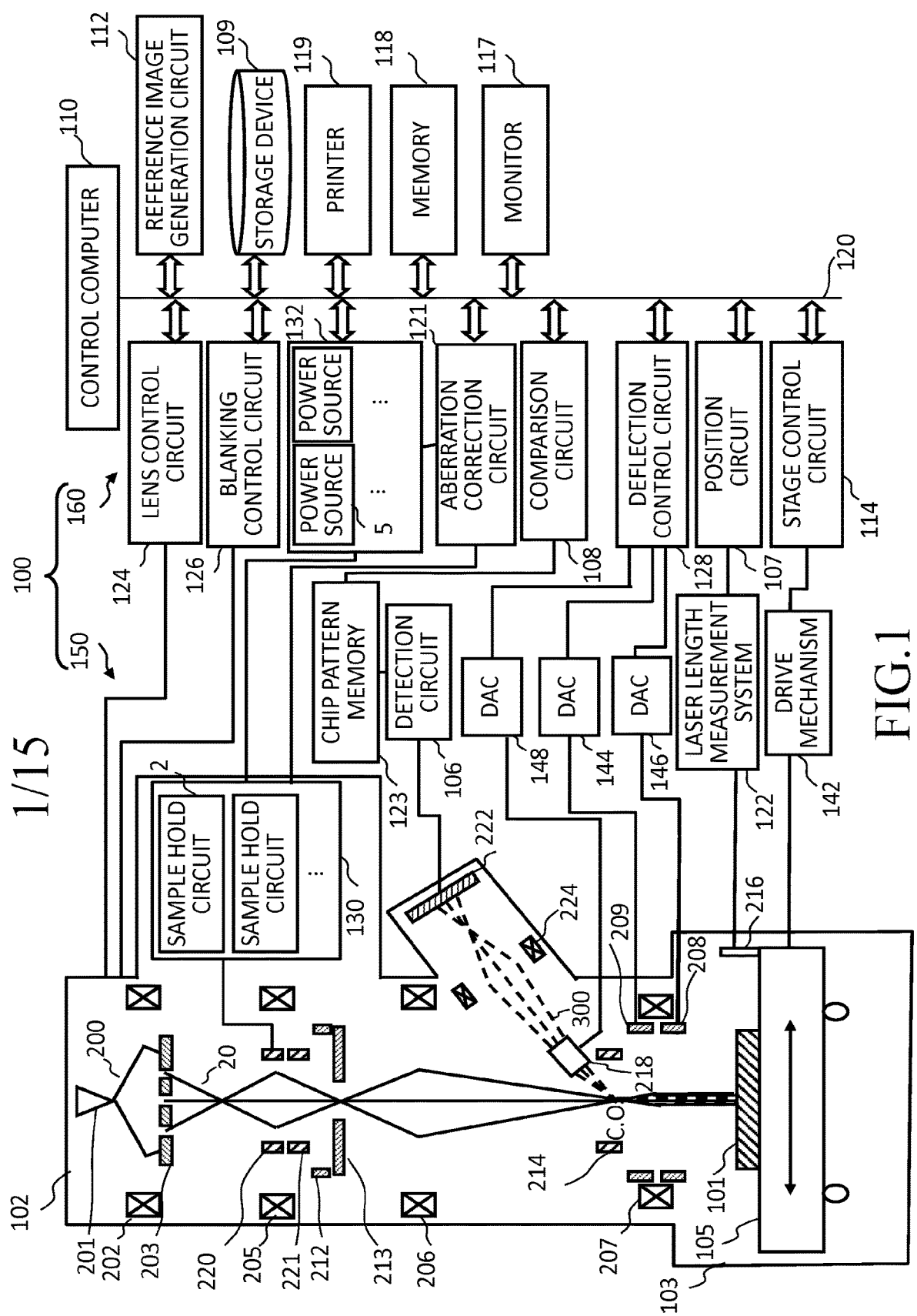
FIG. 1 is a block diagram showing a configuration of a pattern inspection apparatus according to a first embodiment.

FIG. 1 shows an example of the configuration of a pattern inspection apparatus according to a first embodiment. In FIG. 1, an inspection apparatus 100 for inspecting patterns formed on a substrate is an example of a multi-electron beam inspection apparatus. The inspection apparatus 100 includes an image acquisition mechanism 150 and a control system circuit 160. The image acquisition mechanism 150 includes an electron beam column 102 (electron optical column) and an inspection chamber 103. In the electron beam column 102, there are disposed an electron gun 201, an electromagnetic lens 202, a shaping aperture array substrate 203, an electromagnetic lens 205, an aberration corrector 220, an electrostatic lens 221, a bundle blanking deflector 212, a limiting aperture substrate 213, an electromagnetic lens 206, an electromagnetic lens 207 (objective lens), a main deflector 208, a sub deflector 209, an E×B separator 214, a deflector 218, an electromagnetic lens 224, and a multi-detector 222. A primary electron optical system is composed of the electron gun 201, the electromagnetic lens 202, the shaping aperture array substrate 203, the electromagnetic lens 205, the aberration corrector 220, the bundle blanking deflector 212, the limiting aperture substrate 213, the electromagnetic lens 206, the electromagnetic lens 207 (objective lens), the main deflector 208, and the sub deflector 209. A secondary electron optical system is composed of the electromagnetic lens 207, the E×B separator 214, the deflector 218, and the electromagnetic lens 224. The insides of the electron beam column 102 and the inspection chamber 103 are evacuated to be a vacuum state with a desired pressure.

In the inspection chamber 103, there is disposed a stage 105 movable at least in the x and y directions. On the stage 105, a substrate 101 (target object) to be inspected is placed. The substrate 101 may be an exposure mask substrate, or a semiconductor substrate such as a silicon wafer. In the case of the substrate 101 being a semiconductor substrate, a plurality of chip patterns (wafer dies) are formed on the semiconductor substrate. In the case of the substrate 101 being an exposure mask substrate, a chip pattern is formed on the exposure mask substrate. The chip pattern is composed of a plurality of figure patterns. When the chip pattern formed on the exposure mask substrate is exposed and transferred onto the semiconductor substrate a plurality of times, a plurality of chip patterns (wafer dies) are formed on the semiconductor substrate. The case of the substrate 101 being a semiconductor substrate is mainly described below. The substrate 101 is placed, with its pattern-forming surface facing upward, on the stage 105, for example. Moreover, on the stage 105, there is disposed a mirror 216 which reflects a laser beam for measuring a laser length emitted from a laser length measurement system 122 disposed outside the inspection chamber 103. The multi-detector 222 is connected, at the outside of the electron beam column 102, to a detection circuit 106. The detection circuit 106 is connected to a chip pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, an aberration correction circuit 121, a lens control circuit 124, a blanking control circuit 126, a deflection control circuit 128, a power source circuit 132, a storage device 109 such as a magnetic disk drive, a monitor 117, a memory 118, and a printer 119. The deflection control circuit 128 is connected to DAC (digital-to-analog conversion) amplifiers 144, 146 and 148. The DAC amplifier 146 is connected to the main deflector 208, and the DAC amplifier 144 is connected to the sub deflector 209. The DAC amplifier 148 is connected to the deflector 218.

The chip pattern memory 123 is connected to the comparison circuit 108. The stage 105 is driven by a drive mechanism 142 under the control of the stage control circuit 114. In the drive mechanism 142, a drive system such as a three (x-, y-, and θ-) axis motor which provides drive in the directions of x, y, and θ in the stage coordinate system is configured, and therefore, the stage 105 can be moved in the x, y, and θ directions. A step motor, for example, can be used as each of these x, y, and θ motors (not shown). The stage 105 is movable in the horizontal direction and the rotation direction by the x-, y-, and θ-axis motors. The movement position of the stage 105 is measured by the laser length measurement system 122, and supplied (transmitted) to the position circuit 107. Based on the principle of laser interferometry, the laser length measurement system 122 measures the position of the stage 105 by receiving a reflected light from the mirror 216. In the stage coordinate system, the x, y, and θ directions are set, for example, with respect to a plane perpendicular to the optical axis of multiple primary electron beams 20.

The electromagnetic lenses 202, 205, 206, 207 (objective lens), and 224, and the E×B separator 214 are controlled by the lens control circuit 124. The bundle blanking deflector 212 is composed of two or more electrodes (or poles), and each electrode is controlled by the blanking control circuit 126 through a DAC amplifier (not shown).

Further, a sample hold circuit board 130 is disposed in the control system 160. Preferably, the sample hold circuit board 130 is disposed in the electron beam column 102. Thus, the sample hold circuit board 130 is arranged in a vacuum atmosphere. On the other hand, the aberration correction circuit 121 and the power source circuit 132 are disposed in the control room. Therefore, the sample hold circuit board 130 is connected, via a feed through (not shown), to the aberration correction circuit 121 and the power source circuit 132 in the atmospheric pressure. The sample hold circuit board 130 is connected to the aberration corrector 220 (an example of a multipole array).

In the sample hold circuit board 130, there are arranged a plurality of sample hold circuits as will be described later. In the power source circuit 132, there are arranged a plurality of power sources as will be described later. The aberration correction circuit 121 (control circuit) controls the plurality of sample hold circuits. Further, the aberration correction circuit 121 controls the plurality of power sources.

The aberration corrector 220 is configured by electrode substrates arranged in two or more stages as to be described later, and controlled by the aberration correction circuit 121 through the sample hold circuit board 130. The electrostatic lens 221 is configured by, for example, electrode substrates arranged in three or more stages each having an opening in the center through which the whole of the multiple primary electron beams can pass, and controlled by the aberration correction circuit 121.

The sub deflector 209 is composed of four or more electrodes (or poles), and each electrode is controlled by the deflection control circuit 128 through the DAC amplifier 144. The main deflector 208 is composed of four or more electrodes (or poles), and each electrode is controlled by the deflection control circuit 128 through the DAC amplifier 146. The deflector 218 is composed of four or more electrodes (or poles), and each electrode is controlled by the deflection control circuit 128 through the DAC amplifier 148.

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to the applying the acceleration voltage, a voltage is applied to another extraction electrode (Wehnelt), and the cathode is heated to a predetermined temperature, and thereby, electrons from the cathode are accelerated to be emitted as an electron beam 200.

FIG. 1 shows configuration elements necessary for describing the first embodiment. It should be understood that other configuration elements generally necessary for the inspection apparatus 100 may also be included therein.

Figure 2:
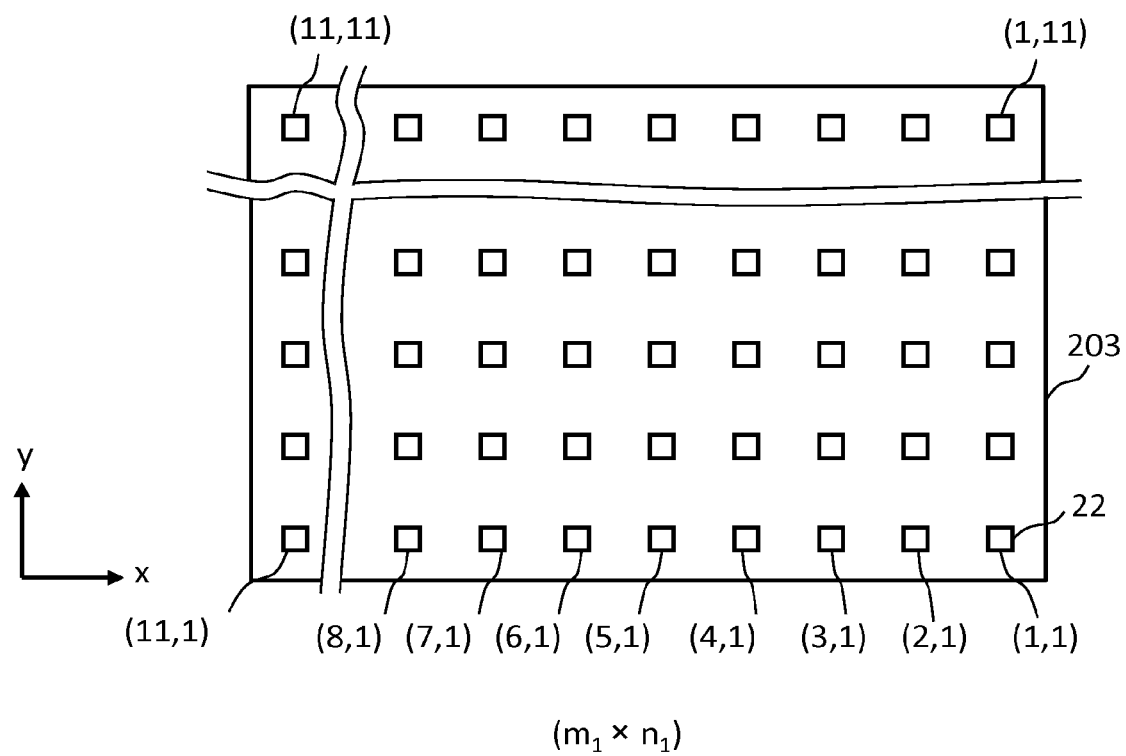
FIG. 2 is a conceptual diagram showing a configuration of a shaping aperture array substrate according to the first embodiment.

FIG. 2 is a conceptual diagram showing a configuration of a shaping aperture array substrate according to the first embodiment. In FIG. 2, holes (openings) 22 of $m_1$ columns wide (x direction)×$n_1$ rows long (y direction) ($m_1$ and $n_1$ are integers of 2 or more) are two-dimensionally formed in the x and y directions at a predetermined arrangement pitch in the shaping aperture array substrate 203. In the case of FIG. 2, holes 22 of 11×11 are formed, for example. Each of the holes 22 is a rectangle (including a square) having the same dimension and shape. Alternatively, each of the holes 22 may be a circle with the same outer diameter. The multiple primary electron beams 20 are formed by letting portions of the electron beam 200 individually pass through a plurality of holes 22. The shaping aperture array substrate 203 serves as an example of an emission source that emits the multiple primary electron beams 20. Although the case where the holes 22 of two or more rows and columns are arranged in both the x and y directions is here shown, the arrangement is not limited thereto. For example, it is also acceptable that a plurality of holes 22 are arranged in only one row (in the x direction) or in only one column (in the y direction). That is, in the case of only one row, a plurality of holes 22 are arranged in the x direction as a plurality of columns, and in the case of only one column, a plurality of holes 22 are arranged in the y direction as a plurality of rows. Further, the method of arranging the holes 22 is not limited to the case of FIG. 2 where the holes are arranged like a grid in the width and length directions. For example, with respect to the x-direction kth and (k+1)th rows which are arrayed in the length direction (in the y direction), each hole in the kth row and each hole in the (k+1)th row may be arranged mutually displaced in the width direction (in the x direction) by a dimension "a". Similarly, with respect to the x-direction (k+1)th and the (k+2)th rows which are arrayed in the length direction (in the y direction), each hole in the (k+1)th row and each hole in the (k+2)th row may be arranged mutually displaced in the width direction (in the x direction) by a dimension "b".

Next, operations of the image acquisition mechanism 150 in the inspection apparatus 100 will be described below.

The electron beam 200 emitted from the electron gun 201 (emission source) is refracted by the electromagnetic lens 202, and illuminates the whole of the shaping aperture array substrate 203. As shown in FIG. 2, a plurality of holes 22 (openings) are formed in the shaping aperture array substrate 203. The region including all of the plurality of holes 22 is irradiated by the electron beam 200. The multiple primary electron beams 20 (multiple primary electron beams) are formed by letting portions of the electron beam 200 applied to the positions of the plurality of holes 22 individually pass through a corresponding one of the plurality of holes 22 in the shaping aperture array substrate 203.

The formed multiple primary electron beams 20 are individually refracted by the electromagnetic lenses 205 and 206, and travel to the electromagnetic lens 207 (objective lens), while repeating forming an intermediate image and a crossover, passing through the E×B separator 214 disposed at the intermediate image position of each beam of the multiple primary electron beams 20. In the meanwhile, the aberration corrector 220 corrects aberration such as a field curvature, an astigmatism and/or a distortion aberration (distortion). Moreover, if deviation of a beam focus position occurs due to the correction by the aberration corrector 220, the electrostatic lens 221 collectively corrects the deviation of the focus position. FIG. 1 shows the case where the aberration corrector 220 is arranged in the magnetic field of the electromagnetic lens 205. By arranging the aberration corrector 220 in the magnetic field of the electromagnetic lens 205, the electric potential to be applied to the control electrode of the aberration corrector 220 can be low compared with that in the case of arranging the aberration corrector 220 outside the magnetic field. For example, it can be reduced to about 1/100. However, it is not limited thereto. What is necessary is that the aberration corrector 220 is arranged between the shaping aperture array substrate 203 and the E×B separator 214.

When the multiple primary electron beams 20 are incident on the electromagnetic lens 207 (objective lens), the electromagnetic lens 207 focuses the multiple primary electron beams 20 onto the substrate 101. That is, the electromagnetic lens 207 (example of electron optical system) leads the multiple primary electron beams 20, whose at least one of field curvature, astigmatism and distortion aberration has been corrected by the aberration corrector 220, to the substrate 101. The multiple primary electron beams 20 having been focused on the substrate 101 (target object) by the objective lens 207 are collectively deflected by the main deflector 208 and the sub deflector 209 to irradiate respective beam irradiation positions on the substrate 101. When all of the multiple primary electron beams 20 are collectively deflected by the bundle blanking deflector 212, they deviate from the hole in the center of the limiting aperture substrate 213 and are blocked by the limiting aperture substrate 213. On the other hand, the multiple primary electron beams 20 which were not deflected by the bundle blanking deflector pass through the hole in the center of the limiting aperture substrate 213 as shown in FIG. 1. Blanking control is provided by On/Off of the bundle blanking deflector 212, and therefore, On/Off of the multiple beams is collectively controlled. Thus, the limiting aperture substrate 213 blocks the multiple primary electron beams 20 which were deflected to be in the "Off condition" by the bundle blanking deflector 212. Then, the multiple primary electron beams 20 for inspection (for image acquisition) are formed by beams having been made during a period from becoming "beam On" to becoming "beam Off" and having passed through the limiting aperture substrate 213.

When desired positions on the substrate 101 are irradiated with the multiple primary electron beams 20 (multiple primary electron beams), a flux of secondary electrons (multiple secondary electron beams 300) including reflected electrons, each corresponding to each of the multiple primary electron beams 20, is emitted from the substrate 101 due to the irradiation with the multiple primary electron beams 20.

The multiple secondary electron beams 300 emitted from the substrate 101 travel to the E×B separator 214 through the electromagnetic lens 207.

The E×B separator 214 (beam separator) includes a plurality of, at least two, magnetic poles each having a coil, and a plurality of, at least two, electrodes (poles). A directive magnetic field is generated by these plurality of magnetic poles. Similarly, a directive electric field is generated by these plurality of electrodes. Specifically, the E×B separator 214 generates an electric field and a magnetic field to be orthogonal to each other in a plane perpendicular to the traveling direction of the center beam (i.e., trajectory center axis) of the multiple primary electron beams 20. The electric field exerts a force in a fixed direction regardless of the traveling direction of electrons. In contrast, the magnetic field exerts a force according to Fleming's left-hand rule. Therefore, the direction of the force acting on electrons can be changed depending on the entering (or "traveling") direction of electrons. With respect to the multiple primary electron beams 20 entering the E×B separator 214 from above, since the forces due to the electric field and the magnetic field cancel each other out, the beams 20 travel straight downward. In contrast, with respect to the multiple secondary electron beams 300 entering the E×B separator 214 from below, since both the forces due to the electric field and the magnetic field are exerted in the same direction, the beams 300 are bent obliquely upward, and separated from the multiple primary electron beams 20.

The multiple secondary electron beams 300 having been bent obliquely upward and separated from the multiple primary electron beams 20 are further bent by the deflector 218, and projected onto the multi-detector 222 while being refracted by the electromagnetic lens 224. The multi-detector 222 detects the projected multiple secondary electron beams 300. The multi-detector 222 includes, for example, a diode type two-dimensional sensor (not shown). Then, at the position of the diode type two-dimensional sensor corresponding to each beam of the multiple primary electron beams 20, each secondary electron of the multiple secondary electron beams 300 collides with the diode type two-dimensional sensor, so that electrons are generated and secondary electron image data is produced for each pixel. An intensity signal detected by the multi-detector 222 is output to the detection circuit 106.

Figure 3:
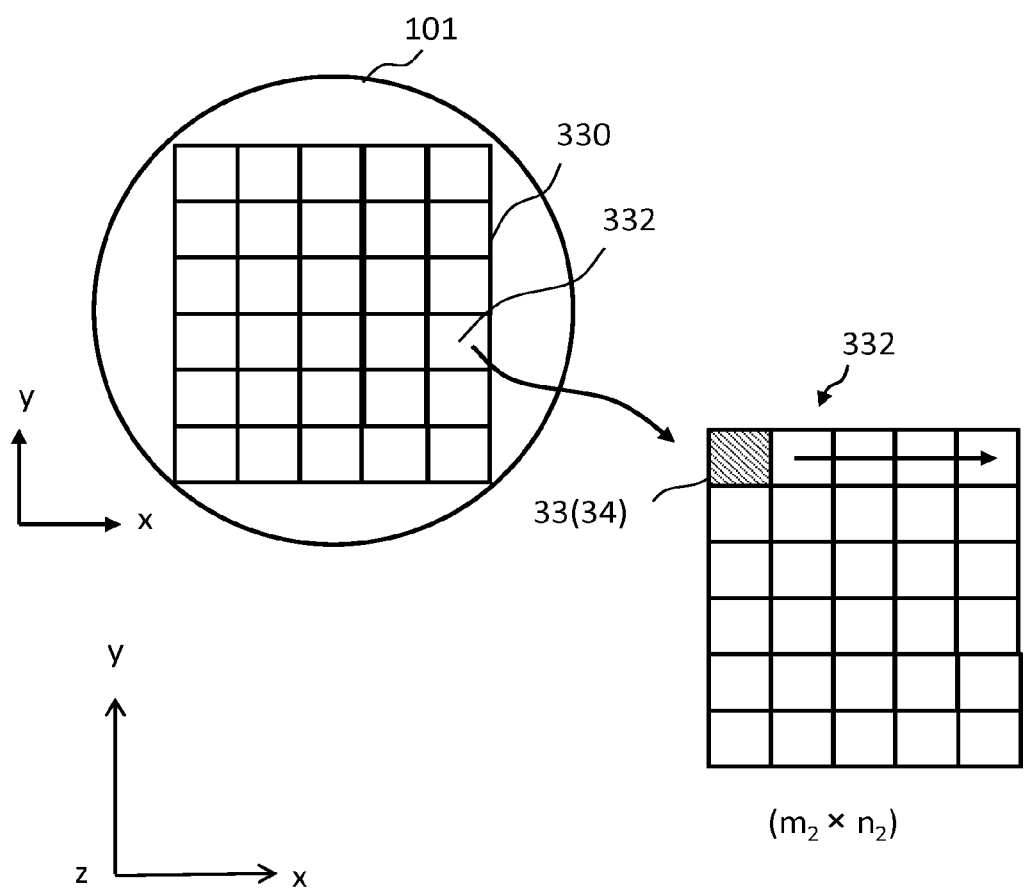
FIG. 3 is an illustration showing an example of a plurality of chip regions formed on a semiconductor substrate, according to the first embodiment.

FIG. 3 is an illustration showing an example of a plurality of chip regions formed on a semiconductor substrate, according to the first embodiment. In FIG. 3, in the case of the substrate 101 being a semiconductor substrate (wafer), a plurality of chips (wafer dies) 332 are formed in a two-dimensional array in an inspection region 330 of the semiconductor substrate (wafer). A mask pattern for one chip formed on an exposure mask substrate has been reduced to, for example, 1/4, and exposed/transferred onto each chip 332 by an exposure device (stepper) (not shown). The inside of each chip 332 is divided into a plurality of mask dies 33 two-dimensionally arrayed in me columns wide (the x direction) and ne rows long (the y direction) (each of $m_2$ and $n_2$ is an integer of 2 or more), for example. In the first embodiment, a mask die 33 serves as a unit inspection region. Movement of the beams to a target mask die 33 is achieved by collectively deflecting all of the multiple primary electron beams 20 by the main deflector 208.

Figure 4:
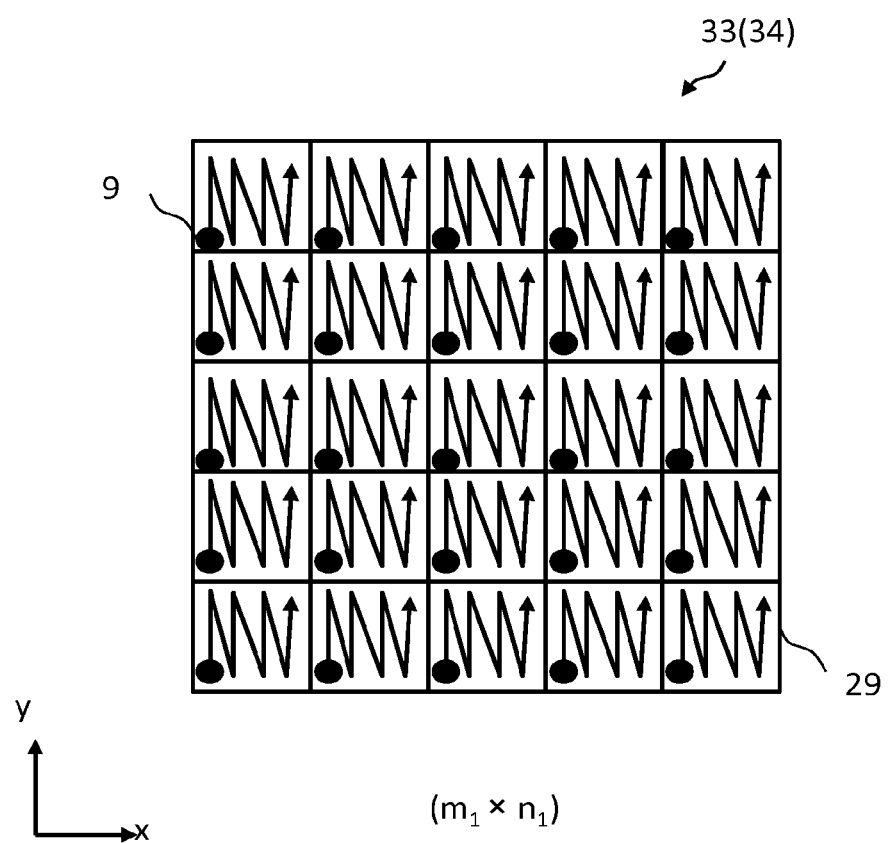
FIG. 4 is an illustration showing a scanning operation with multiple beams according to the first embodiment.

FIG. 4 is an illustration showing a scanning operation with multiple beams according to the first embodiment. FIG. 4 shows the case of the multiple primary electron beams 20 of 5×5 (rows by columns). An irradiation region 34 which can be irradiated by one irradiation with the multiple primary electron beams 20 is defined by (x direction size obtained by multiplying a beam pitch in the x direction of the multiple primary electron beams 20 on the substrate 101 by the number of beams in the x direction)×(y direction size obtained by multiplying a beam pitch in the y direction of the multiple primary electron beams 20 on the substrate 101 by the number of beams in the y direction). In the case of FIG. 4, the irradiation region 34 and the mask die 33 are of the same size. However, it is not limited thereto. The irradiation region 34 may be smaller than the mask die 33, or larger than it. The inside of a sub-irradiation region 29 is scanned by each primary electron beam 9 of the multiple primary electron beams 20, where the sub-irradiation region 29 is surrounded by the beam pitch in the x direction and the beam pitch in the y direction and the beam concerned itself is located therein. Each beam of the multiple primary electron beams 20 is associated with any one of the sub-irradiation regions 29 which are different from each other. At the time of each shot, each beam is applied to the same position in the associated sub-irradiation region 29. Beam movement in the sub-irradiation region 29 is achieved by a collective deflection of all the multiple primary electron beams 20 by the sub deflector 209. By repeating this operation, the inside of one sub-irradiation region 29 is irradiated, in order, with one beam. Although FIG. 4 show the case where the inside of the sub irradiation region 29 is scanned by four lines proceeding in the y direction, the line scanning is actually performed using more lines such as 512 lines as will be described later.

The multiple secondary electron beams 300, including reflected electrons and being corresponding to the multiple primary electron beams 20, are emitted from the substrate 101 because desired positions on the substrate 101 are irradiated with the multiple primary electron beams 20 whose aberration has been corrected by the aberration corrector 220. The multiple secondary electron beams 300 emitted from the substrate 101 travel to the E×B separator 214, and are bent obliquely upward. The trajectory of the multiple secondary electron beams 300 having been bent obliquely upward is bent by the deflector 218, and projected on the multi-detector 222. Thus, the multi-detector 222 detects the multiple secondary electron beams 300 emitted because the substrate 101 was irradiated with the multiple primary electron beams 20. Reflected electrons may be emitted in the middle of the optical path.

As described above, the mask die 33 serving as the irradiation region 34 is scanned by all the multiple primary electron beams 20, and one sub-irradiation region 29 is scanned by each corresponding beam. Then, after completing scanning one mask die 33, the irradiation region 34 is moved to a next adjacent mask die 33 to be scanned. This operation is repeated to proceed scanning of each chip 332. Due to shots of the multiple primary electron beams 20, secondary electrons are emitted from the irradiated positions at each shot time, and detected by the multi-detector 222.

FIGS. 5A and 5B are top views showing examples of the configuration of each electrode substrate of an aberration corrector according to the first embodiment.

Figure 6:
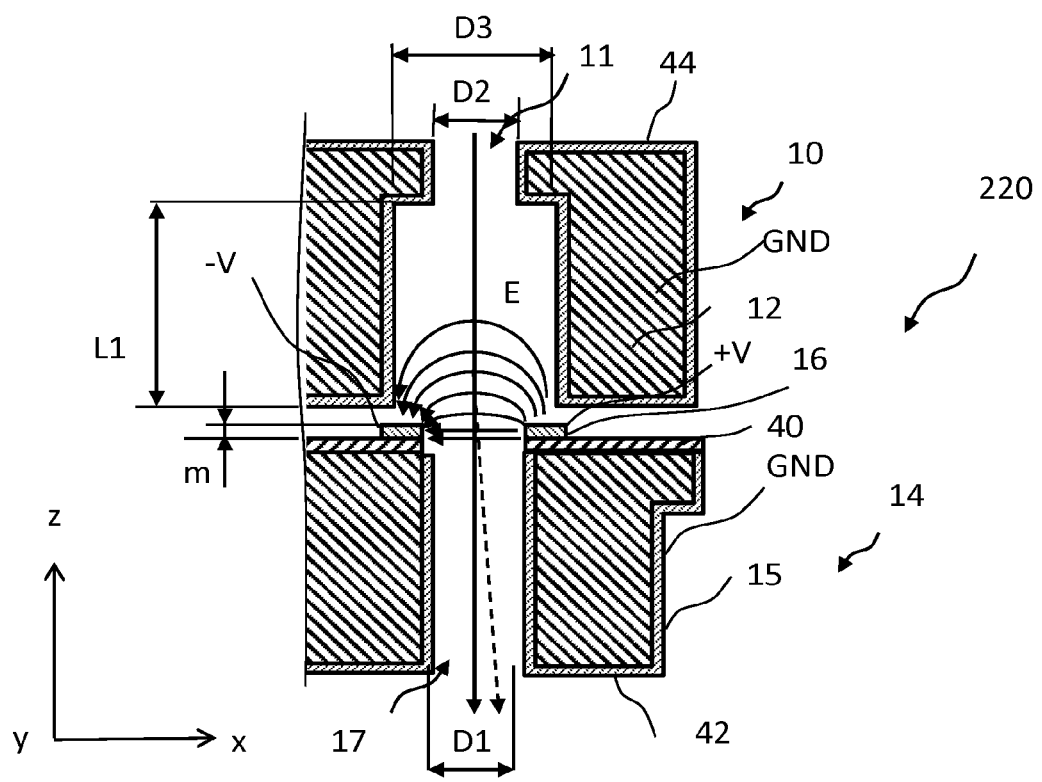
FIG. 6 is a sectional view showing an example of a configuration of an aberration corrector according to the first embodiment.

FIG. 6 is a sectional view showing an example of the configuration of an aberration corrector according to the first embodiment.

The aberration corrector 220 is configured by electrode substrates, arranged in two or more stages, with a predetermined space therebetween. FIGS. 5A and 5B show the case of using 5×5 multiple primary electron beams 20. The aberration corrector 220 (multipole array) includes a plurality of multipoles 13 each of which is arranged at a position, where a corresponding beam of the multiple primary electron beams 20 passes through, to surround the corresponding beam. It is specifically described below.

In a first electrode substrate 10, a plurality of passage holes 11 (first passage holes) through which the multiple primary electron beams 20 pass are formed in a substrate body 12. As shown in FIGS. 5A and 6, in the first electrode substrate 10, the plurality of passage holes 11 are formed at the positions through which the multiple primary electron beams 20 with a beam pitch P pass. Each of the plurality of passage holes 11 of the first electrode substrate 10 is formed such that its size from the top surface (the upstream side of the beam travelling direction) of the substrate body 12 to the middle toward the back side of the substrate body 12 is a hole diameter D2 (the second hole diameter), and its size from the middle to the back side is a hole diameter D3 (the third hole diameter) being larger than D2. As shown in FIG. 6, the top surface, side surface, and bottom surface of the substrate body 12, and the inner walls of a plurality of passage holes 11 are covered with a shield electrode 44. The shield electrode 44 is disposed at least at the inner walls of the plurality of passage holes 11.

A second electrode substrate 14 is arranged at the position below (the downstream side of the beam travelling direction) the first electrode substrate 10. In the second electrode substrate 14, a plurality of passage holes 17 (second passage holes) through which the multiple primary electron beams 20 with the beam pitch P pass are formed in a substrate body 15. As shown in FIGS. 5B and 6, each of the plurality of passage holes 17 of the second electrode substrate 14 is formed to have a hole diameter D1 (first hole diameter) from the top surface to the rear surface of the substrate body 15. The multipole 13 of four or more electrodes (or poles) is arranged, for each passage hole 17, circumferentially on the upper surface of the passage hole 17. As the multipole 13, a plurality of electrodes 16 (example of first electrodes) are arranged. FIG. 5B shows the case where eight electrodes 16 (a to h) (example of first electrodes) are arranged. For example, in the case of correcting a distortion aberration of the multiple primary electron beams 20, it is sufficient to have, for each beam, four electrodes 16 where pairs of two electrodes facing each other are orthogonally (x and y directions) arranged. For example, in the case of correcting an astigmatism of the multiple primary electron beams 20, it is preferable, for each beam, that eight electrodes 16 are disposed where, in addition to the pairs of two electrodes being orthogonally (x and y directions) arranged, pairs of two electrodes facing each other are arranged in 45' and 135° directions being intermediate phases. If the direction of the astigmatism is known, it is also sufficient to have four electrodes 16 where pairs of two electrodes facing each other are orthogonally (x and y directions) arranged. As to the second electrode substrate 14, an insulating layer 40 is arranged between the substrate body 15 and a plurality of electrodes 16 (a to h) for each beam. As shown in FIG. 6, the side surface and bottom surface of the substrate body 15, and the inner walls of the plurality of passage holes 17 are covered with a shield electrode 42.

As the material of the substrate body 12 of the first electrode substrate 10, and that of the substrate body 15 of the second electrode substrate 14, for example, it is preferable to use silicon (Si). For example, an Si substrate having a film thickness of about several 100 μm is preferable for the substrate bodies 12 and 15. As the material of a plurality of electrodes 16 (a to h) for each beam, it is preferable to use, for example, a metal not being easily oxidized, such as aluminum (Al), platinum (Pt), titanium (Ti), or palladium (Pd). As the material of the shield electrodes 42 and 44, similarly to the case of the electrode 16, it is preferable to use a metal not being easily oxidized, such as Al, Pt, Ti, or Pd.

In the case of correcting an astigmatism or a distortion, +V potential is applied to one of two electrodes facing each other in a plurality of electrodes 16 for one beam. −V potential, whose sign has been reversed, being the same potential as V is applied to the other one. In the case of correcting a field curvature, an equivalent potential is applied to each of a plurality of electrodes 16 for one beam. The ground (GND) potential is applied to the shield electrodes 42 and 44.

In the aberration corrector 220, as shown in FIG. 6, the passage hole 11 of the first electrode substrate 10 is formed to be wider than the passage hole 17 of the second electrode substrate 14 where the electrode 16 is disposed. Then, the above the electrode 16 is open due to the passage hole 11. Therefore, it is possible to extend the electric field E also to the space in the passage hole 11 above the two counter electrodes 16. Further, in the aberration corrector 220, as shown in FIG. 6, since the upper part of the passage hole 11 of the first electrode substrate 10 is narrowed by the flange portion, from the hole diameter D3 to the hole diameter D2, the direction of the line of electric force can be easily bent. Therefore, the electric field E can be formed in the passage hole 11 above the two counter electrodes 16, without being emitted upward the first electrode substrate 10. Accordingly, it is possible to apply an electric field to an electron beam having entered the passage hole 11 of the first electrode substrate 10, during passing through the passage hole 11. Thus, the deflection fulcrum can be formed in the middle of the passage hole 11 above the electrode 16. Because of this, the thickness of the electrode 16 can be reduced.

Figure 7:
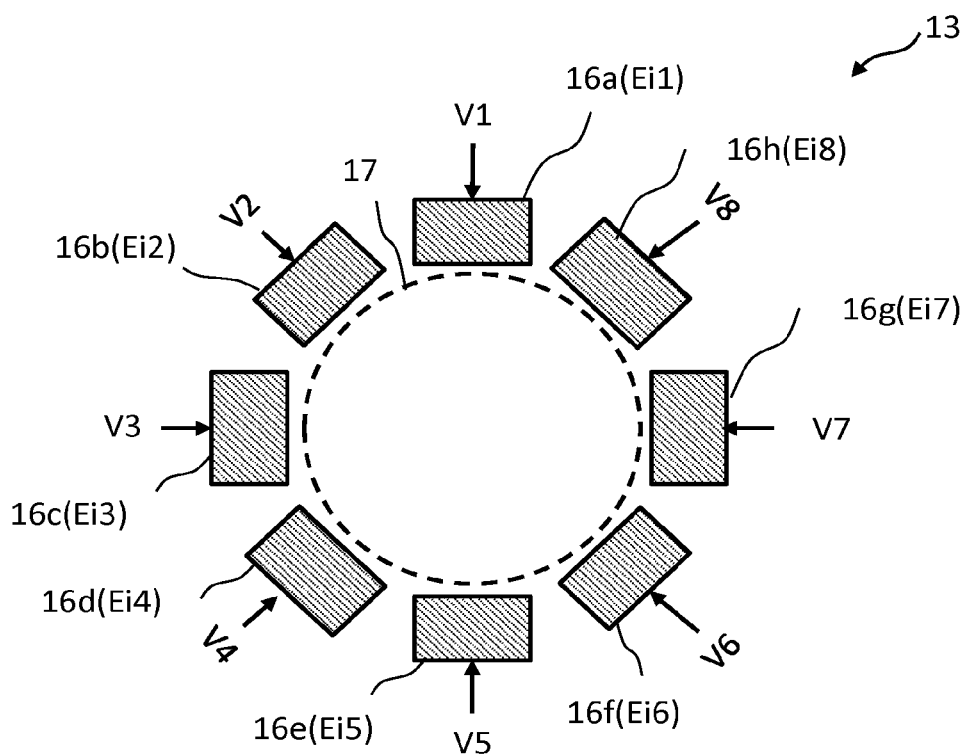
FIG. 7 is an illustration describing a multipole and an applied potential according to the first embodiment.

FIG. 7 is an illustration describing a multipole and an applied potential according to the first embodiment. In FIG. 7, eight electrodes 16a to 16h are disposed, as the multipole 13 for each beam, at positions to surround a corresponding beam which passes therethrough. FIG. 7 shows an electrode (Eij) of an electrode number j for a beam whose index is i in the multiple primary electron beams 20 in an array. j indicates electrode numbers from 1 to 8. FIG. 7 shows electrodes Ei1 to Ei8 for the beam of the index i. A potential V1 is applied to the electrode 16a (Ei1). A potential V2 is applied to the electrode 16b. A potential V3 is applied to the electrode 16c. A potential V4 is applied to the electrode 16d. A potential V5 is applied to the electrode 16e. A potential V6 is applied to the electrode 16f. A potential V7 is applied to the electrode 16g. A potential V8 is applied to the electrode 16h.

For individually correcting each beam by using a multipole array such as the aberration corrector 202, controlling should be individually performed per beam and per electrode. Therefore, needed are power sources whose number is the same as that obtained by multiplying the number of beams by the number of electrodes of the multipole. With increase in the number of the beams, the number of the power sources also increases, which causes a problem that it is difficult to mount them. For example, with respect to 11×11 multiple primary electron beams, there are beams of i=1 to 121. In the aberration corrector 220, if eight electrodes 16 are arranged for each beam, 121×8 power sources are needed in order to individually correct each beam. Then, according to the first embodiment, a plurality of sample hold circuits are arranged whose number is greater than or equal to the number obtained by multiplying the number of beams of the multiple primary electron beams 20 by the number (e.g., eight) of electrodes of the multipole for one beam of the multiple primary electron beams 20. In the case of FIG. 7, the sample hold circuits are individually arranged for each of electrodes whose number is obtained by multiplying eight (the number of electrodes) by the number of beams. Each of the plurality of sample hold circuits (first sample hold circuit) includes a capacitor and a switch, the each of the plurality of sample hold circuits is arranged for each electrode 16 of each of a plurality of multipoles 13. The sample hold circuit holds, using the capacitor and the switch, a potential to be applied to the electrode 16 concerned. It is specifically described below.

Figure 8:
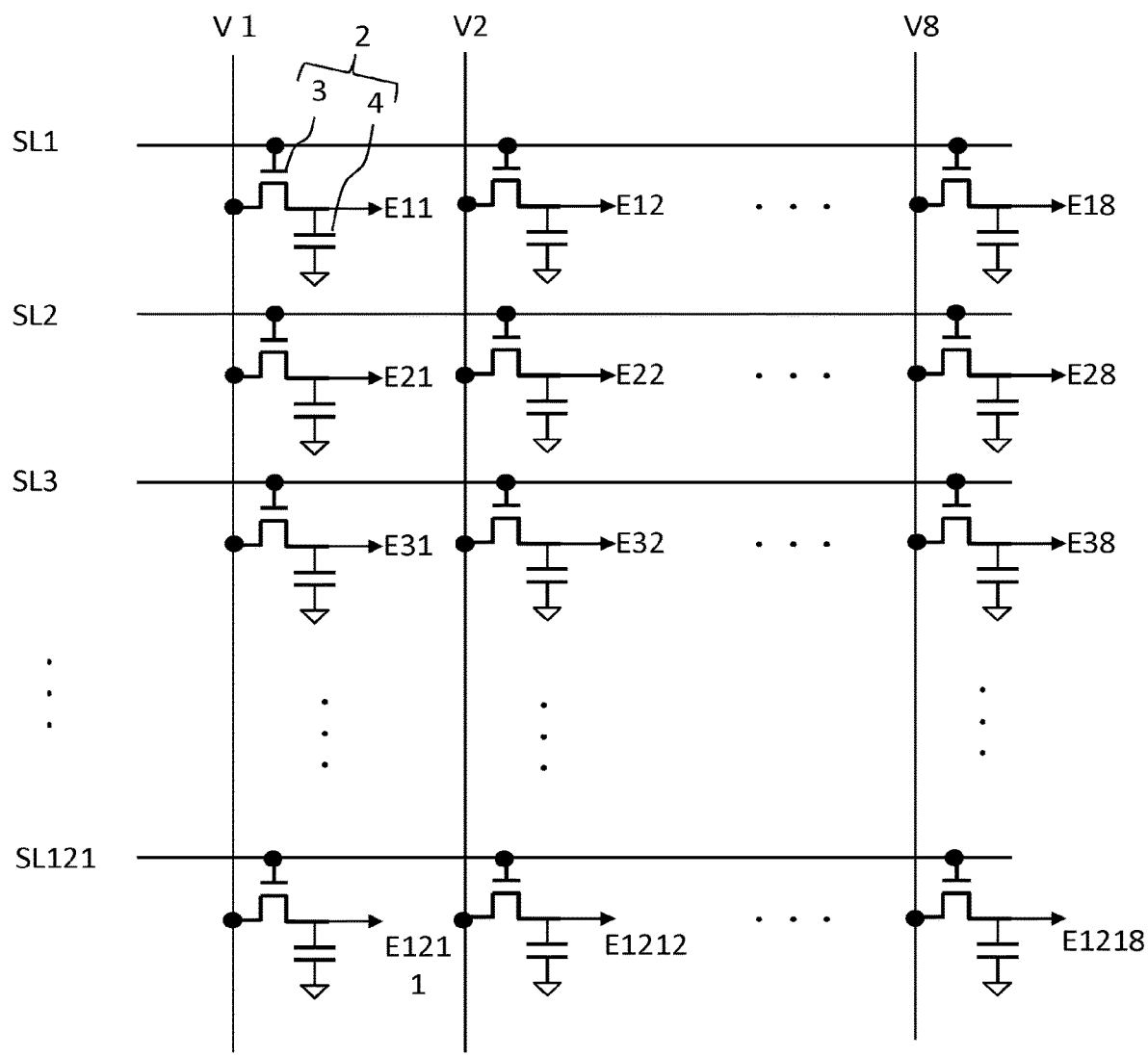
FIG. 8 is an illustration showing an example of a plurality of sample hold circuits according to the first embodiment.

FIG. 8 is an illustration showing an example of a plurality of sample hold circuits according to the first embodiment. In FIG. 8, eight sample hold circuits 2 are laterally arranged for connecting a plurality of electrodes Ei1 to Ei8 which are for the same beam. Then, groups of sample hold circuits 2, each group being composed of eight sample hold circuits 2 laterally arranged, the number of the groups being the same as that of beams, are arrayed lengthwise. The example of FIG. 8 shows the case where the 11×11 multiple primary electron beams 20 are used. Thus, since 121 beams exist, 121 groups of the sample hold circuits 2, each group being composed of eight sample hold circuits 2 laterally arranged, are arrayed lengthwise. Therefore, totally, 121×8 sample hold circuits (first sample hold circuits) are arranged.

Each sample hold circuit 2 includes a switch 3 and a capacitor 4. Inputs of eight switches 3 with respect to a beam i are connected to the line of the control pulse signal SLi. For example, inputs of eight switches 3 for the beam 1 are connected to the line of the control pulse signal SL1. Inputs of eight switches 3 for the beam 121 are connected to the line of the control pulse signal SL121. The switch 3 of the electrode number 1 for each beam is connected to the potential V1 line from the power source 1. The switch 3 of the electrode number 2 for each beam is connected to the potential V2 line from the power source 2. Similarly, the switch 3 of the electrode number 8 for each beam is connected to the potential V8 line from the power source 8. With respect to the output of each switch 3, one terminal of the capacitor 4 and a corresponding electrode Eij are connected in parallel. The other terminal of each capacitor is connected to a ground potential. In this way, 121×8 sample hold circuits 2 are arranged in an array. These 121×8 sample hold circuits 2 are disposed in the sample hold circuit board 130.

In the power source circuit 132, a plurality of power sources which apply a plurality of electric potentials to a plurality of sample hold circuits in the sample hold circuit board 130 are arranged. The number of the plurality of power sources is less than a value obtained by multiplying the number of beams of the multiple primary electron beams 20 by the number of electrodes of the multipole 13 for one beam. Furthermore, the number of the plurality of power sources is less than the number of beams of the multiple primary electron beams 20. For example, power sources whose number is the same as that of electrodes for one beam are arranged. Here, eight power sources 1 to 8 are arranged. The potential V1 from the power source 1 is connected to the switch 3 of the electrode number 1 for each beam. The potential V2 from the power source 2 is connected to the switch 3 of the electrode number 2 for each beam. Similarly, the potential V8 from the power source 8 is connected to the switch 3 of the electrode number 8 for each beam.

Figure 9:
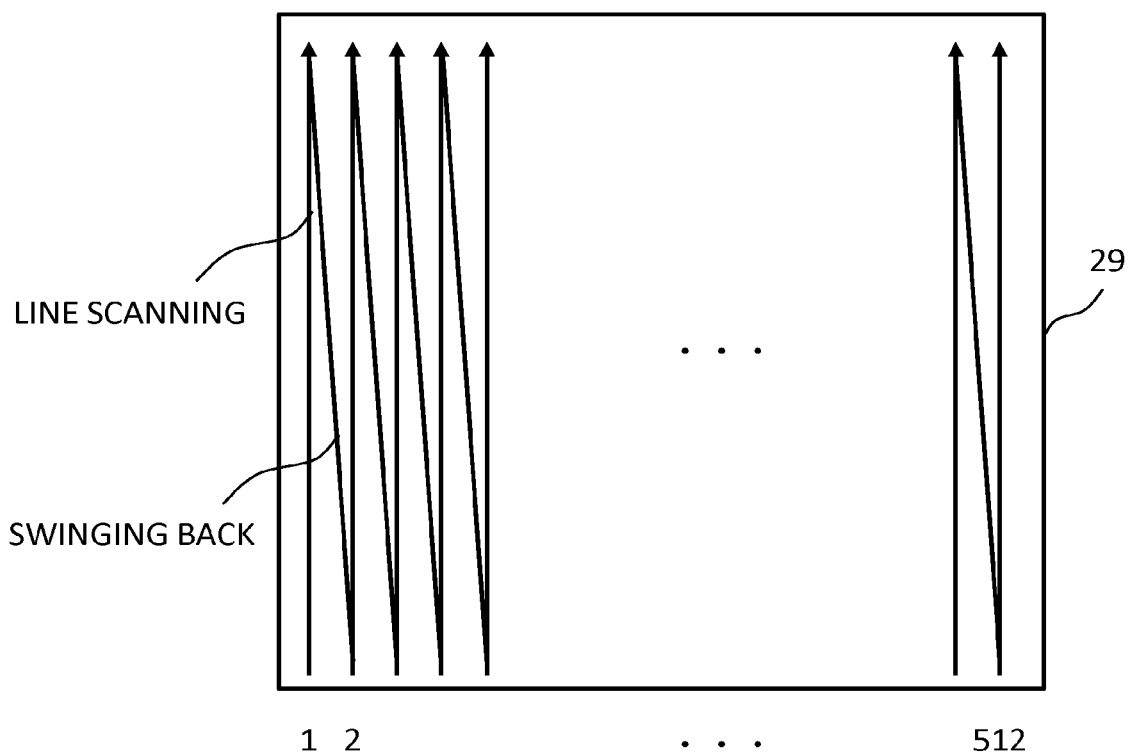
FIG. 9 is an illustration describing a line scanning operation and a control method of a sample hold circuit according to the first embodiment.

FIG. 9 is an illustration describing a line scanning operation and a control method of a sample hold circuit according to the first embodiment. The sub deflector 209, being an example of an objective deflector, scans the substrate 101 with the multiple primary electron beams 20 by collectively deflecting the multiple primary electron beams 20 having passed through the aberration corrector 220 (multipole array). The sub deflector 209 scans the sub irradiation region 29 (a desired region) for each beam by performing a plurality of line scanning operations by repeating the collective beam deflection. Specifically, for example, in FIG. 9, the inside of each sub irradiation region 29 is scanned (line scanning), for example, 512 times with a corresponding primary electron beam 9. After the line scanning is completed once, the beam is swung back to the position to start the next line scanning. Such an operation is repeated, for example, 512 times in order to scan the whole of one sub irradiation region 29.

The aberration correction circuit 121 (control circuit) controls 121×8 sample hold circuits 2 (first sample hold circuit) such that a plurality of potentials V1 to V8 having been applied to the 121×8 sample hold circuits 2 are held, in synchronization with swinging back of the collective beam deflection by the sub deflector 209 being an objective deflector, by eight (a plurality of) sample hold circuits 2 (second sample hold circuit) selected from the 121×8 sample hold circuits 2. The selection of eight (a plurality) sample hold circuits 2 (second sample hold circuit) is changed for each swinging back of the collective beam deflection. Further, the aberration correction circuit 121 changes, in synchronization with at least one line scanning operation of a plurality of line scanning operations, each of the potentials V1 to V8 of a plurality of power sources 1 to 8.

Figure 10:
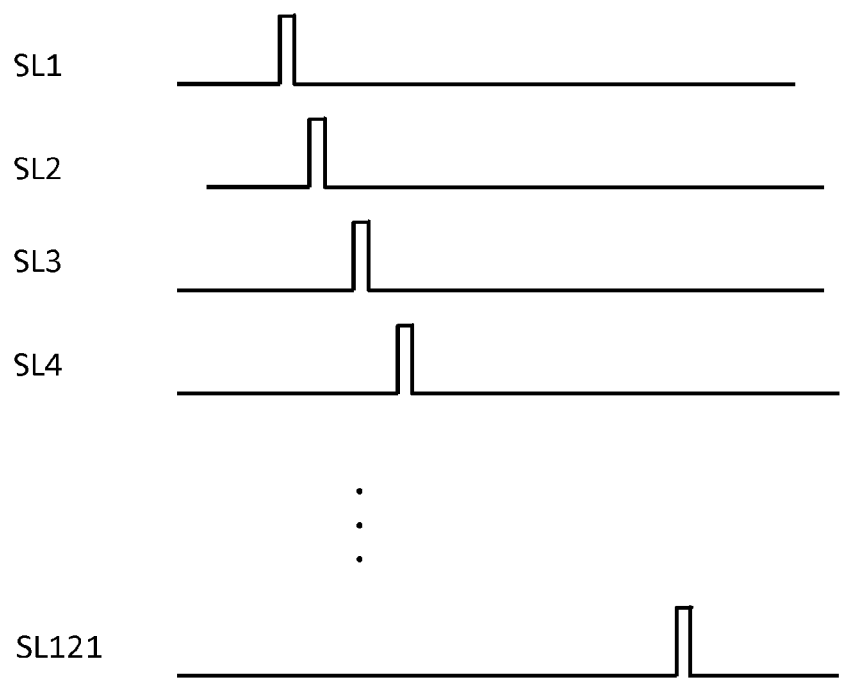
FIG. 10 is an illustration showing an example of a time chart of a control pulse signal according to the first embodiment.

FIG. 10 is an example of a time chart of a control pulse signal according to the first embodiment. For example, during the first-time line scanning operation, potentials V1 to V8 of the power sources 1 to 8 are individually changed to be potentials V1 to V8 for correcting the beam 1. Then, after the first-time line scanning operation is completed, the control pulse signal SL1 is transmitted, for example, once, in synchronization with swinging back to the position to start the second-time line scanning operation. Thereby, while the control pulse signal SL1 is in an ON state, potentials V1 to V8 are applied to the electrodes E11 to E18 of the multipole 13 for correction of beam 1. With this, the potentials V1 to V8 are individually applied to the capacitors 4 of eight sample hold circuits 2 for correction of beam 1. In other words, in the first swinging back, eight sample hold circuits 2 for correction of beam 1 are selected. Even if the control pulse signal SL1 becomes OFF, the eight sample hold circuits 2 for beam 1 correction individually hold the electric potentials V1 to V8. Specifically, potentials V1 to V8 individually accumulated in the capacitors 4 of the eight sample hold circuits 2 for correction of beam 1 are individually applied to the electrodes E11 to E18. Therefore, applying the potentials V1 to V8 for beam 1 correction to the electrodes E11 to E18 of the multipole 13 for correction of beam 1 is continuously held. Thereby, aberration of the beam 1 is corrected.

After the first swinging back is completed, during the second-time line scanning operation, potentials V1 to V8 of the power sources 1 to 8 are individually changed to be potentials V1 to V8 for correcting the beam 2. Then, after the second-time line scanning operation is completed, the control pulse signal SL2 is transmitted, for example, once, in synchronization with swinging back to the position to start the third-time line scanning operation. Thereby, while the control pulse signal SL2 is in an ON state, potentials V1 to V8 are applied to the electrodes E21 to E28 of the multipole 13 for correction of beam 2. With this, the potentials V1 to V8 are individually applied to the capacitors 4 of eight sample hold circuits 2 for correction of beam 2. In other words, in the second swinging back, eight sample hold circuits 2 for correction of beam 2 are selected. Even if the control pulse signal SL2 becomes OFF, the eight sample hold circuits 2 for correction of beam 2 individually hold the electric potentials V1 to V8. Specifically, potentials V1 to V8 individually accumulated in the capacitors 4 of the eight sample hold circuits 2 for beam 2 correction are individually applied to the electrodes E21 to E28. Therefore, applying the potentials V1 to V8 for correction of beam 2 to the electrodes E21 to E28 of the multipole 13 for correction of beam 2 is continuously held. Thereby, aberration of the beam 2 is corrected.

By repeating this operation 121 times, applying potentials V1 to V8 for correction of each of all the beams to the electrodes Ei1 to Ei8 of the multipole 13 for correction of each of all the beams is continuously held. Thereby, an aberration of each beam is corrected individually. When the first line is scanned with each beam, the capacitor of the sample hold circuit has already been charged with a necessary potential.

Figure 11:
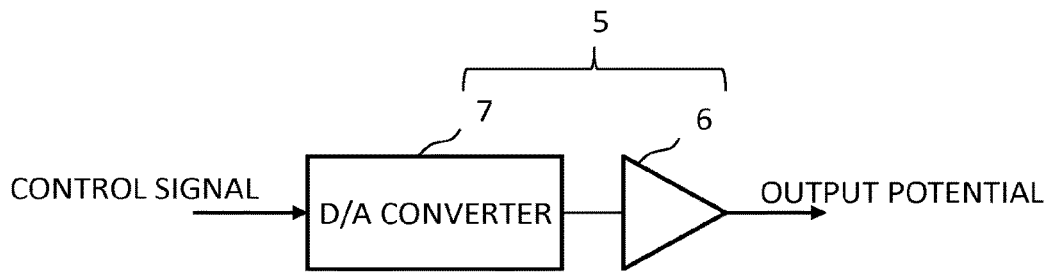
FIG. 11 is an illustration showing an example of a configuration of a power source according to the first embodiment.

FIG. 11 is an illustration showing an example of the configuration of a power source according to the first embodiment. FIG. 11 shows one of eight power sources disposed in the power source circuit 132. Each of power sources 5 includes a D/A (digital analog) converter 7 and an operational amplifier 6. Each of the power sources 5 variably adjusts an electric potential by using the D/A converter 7 and the operational amplifier 6. The required potential range is controlled by, for example, 16 bit resolution (512 gray scale levels). The aberration correction circuit 121 outputs a 16-bit digital control potential signal, which indicates an electric potential to be next applied, to the D/A converter 7. The D/A converter 7 performs D/A conversion on the 16-bit digital control potential signal, and outputs it to the operational amplifier 6. Then, a desired potential is output from the operational amplifier 6 to the sample hold circuit.

When, with respect to 121 beams, sample holding of a potential is performed once for each electrode, it is completed by line scanning operations of 121 times. In the case of 512 line scanning, sample holding for every 121 lines can be performed four times. In other words, the potential to be applied to the electrode 16 for controlling each beam can be refreshed four times. If the 512 line scanning takes, for example, 4.5 ms, the time necessary before the next refreshment is 1.125 ms. Supposing that an allowable voltage fluctuation at the time of the electrode 16 being irradiated with the electron of 1 nA is 100 µV, the capacity C greater than or equal to 1 nA×1.125 ms/100 µV=11.25 nF is enough for the capacitor 4. It is adequately possible to mount a capacitor having such a capacity.

Further, in the example described above, the scanning cycle of one line is 8.789 µs, in which swinging back takes 500 ns. It is enough that refreshing is completed within such a time. As a result of simulation, refreshing was sufficiently able to be completed within such a time.

Figure 12:
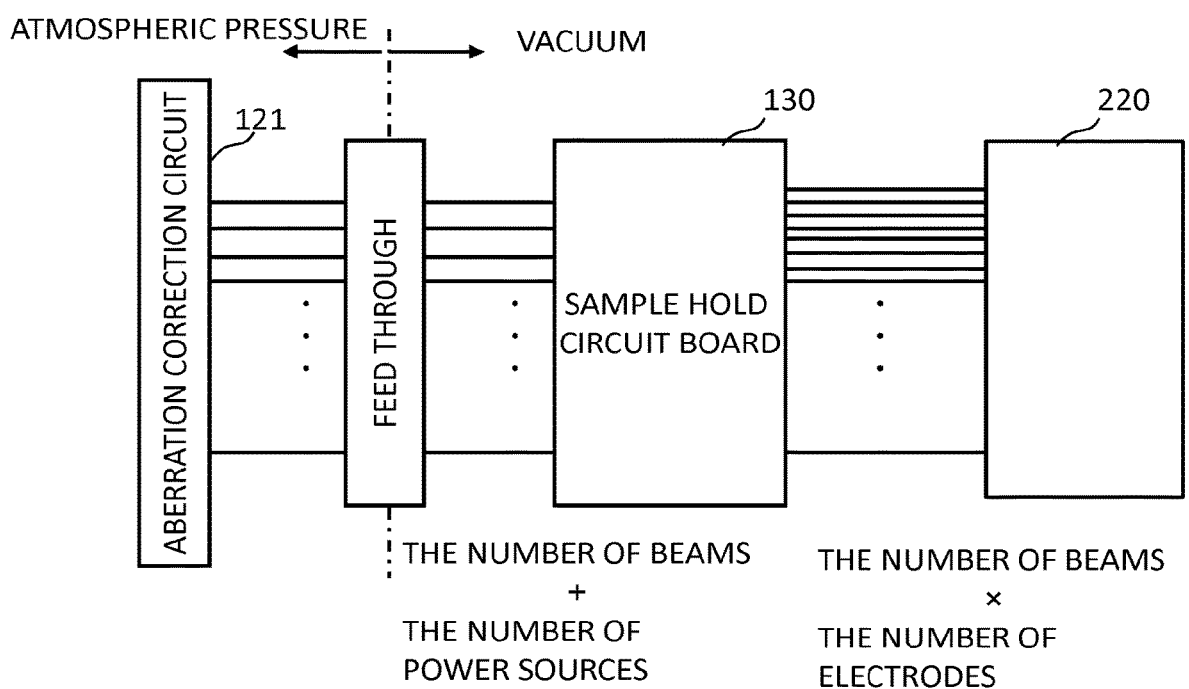
FIG. 12 is an illustration describing the number of wires according to the first embodiment.

FIG. 12 is an illustration describing the number of wires according to the first embodiment. The aberration corrector 220 needs power sources whose number is obtained by multiplying the number of beams by the number of electrodes. Therefore, the sample hold circuit board 130 and the aberration corrector 220 are connected by wires whose number is at least (the number of beams)×(the number of electrodes (e.g., 121×8)). On the other hand, the number of wires connecting between the sample hold circuit board 130 and the aberration correction circuit 121 can be reduced to a value obtained by adding the number of the control pulse signals SLi, namely 121, and the number of power sources, namely 8. Therefore, the number of wires between the feed through and the sample hold circuit board 130 which are relays can be reduced to a value obtained by adding the number of the control pulse signals SLi, namely 121, and the number of power sources, namely 8. Thus, the number of wires of the feed through disposed at the border between the atmospheric pressure environment and the vacuum environment can be reduced.

Figure 13A:
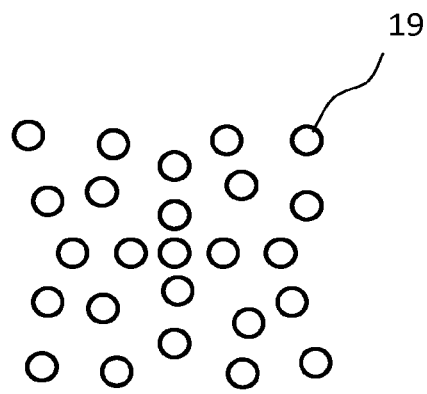
FIGS. 13A and 13B are illustrations showing an example of distortion aberration (distortion) according to the first embodiment.
Figure 13B:
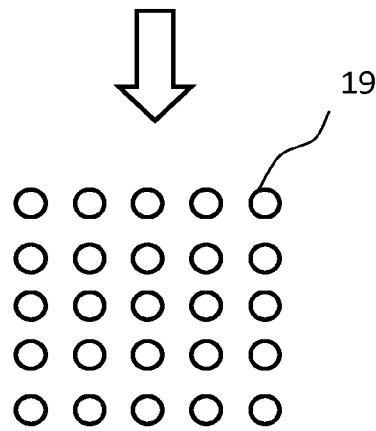
Figure 13B:
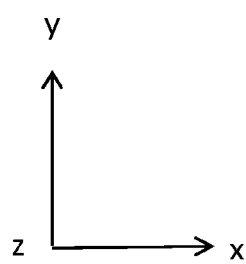

FIGS. 13A and 13B show an example of distortion aberration (distortion) according to the first embodiment. In the case of FIGS. 13A and 13B, 5×5 multiple primary electron beams 20 are used. If a plurality of holes 22 are formed in a matrix in the x and y directions at a predetermined pitch in the shaping aperture array substrate 203, ideally, as shown in FIG. 13B, irradiation positions 19 of the multiple primary electron beams 20 on the substrate 101 should also be arranged in a matrix with a predetermined reduction ratio. However, due to the usage of the electron optical system of electromagnetic lenses, etc., distortion (distortion aberration) occurs as shown in FIG. 13A. With respect to the shape of the distortion, it depends on conditions and represents a distribution called a barrel type or a pincushion type. Generally, distortion of a magnetic lens shifts not only in the radial direction but also in the rotational direction. FIG. 13A shows the case under conditions of not generating rotational components. Even if a certain amount of tendency exists in the direction of distortion and the amount of position deviation in the multiple primary electron beams 20, it differs for each beam. Therefore, in order to correct such distortion, it is necessary to perform correction for each individual beam. Using the aberration corrector 220 according to the first embodiment, the irradiation positions 19 of the multiple primary electron beams 20 on the substrate 101 can be corrected by correcting the beam trajectory for each beam as shown in FIG. 13B.

Figure 14A:
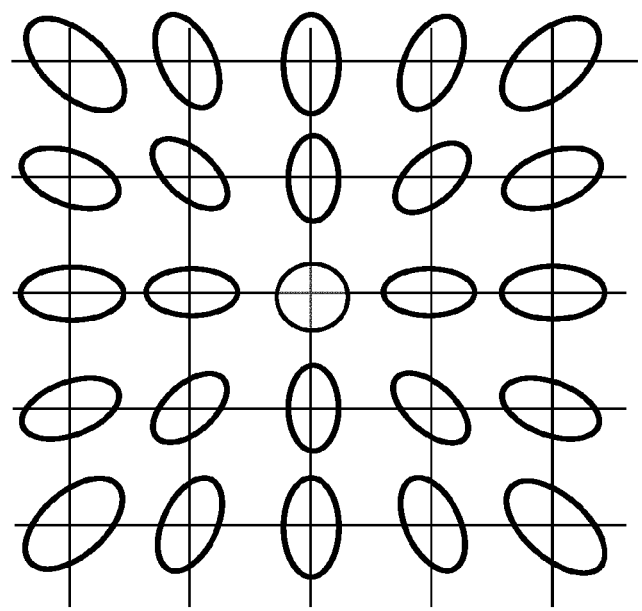
FIGS. 14A and 14B are illustrations showing an example of an astigmatism according to the first embodiment.
Figure 14A:
Figure 14B:
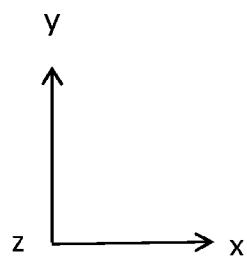
Figure 14B:
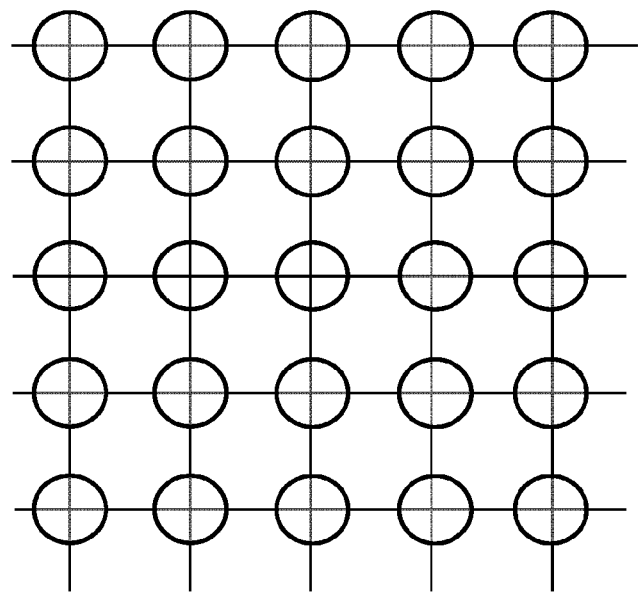

FIGS. 14A and 14B show an example of an astigmatism according to the first embodiment. In the case of FIGS. 14A and 14B, 5×5 multiple primary electron beams 20 are used. As shown in FIG. 14B, ideally, the shape of irradiation with each beam is circular. However, due to usage of the electron optical system of electromagnetic lenses and the like, an astigmatism occurs as shown in FIG. 14A. Therefore, as shown in FIG. 14A, the focus position deviates in the two-dimensional x and y directions on the substrate 101 (target object), which makes the beam a so-called elliptic form at the focus position, and thus, blur occurs in the irradiating beam. Although the direction of astigmatism and the amount of position deviation in the multiple primary electron beams 20 tend to become an elliptic form extending radially from the center of the multiple primary electron beams 20, it differs for each beam. Therefore, in order to correct such an astigmatism, it is necessary to perform correction for each individual beam. Then, as shown in FIG. 14B, the astigmatism can be corrected by correcting the beam trajectory of each beam by using the aberration corrector 220 according to the first embodiment.

Figure 15A:
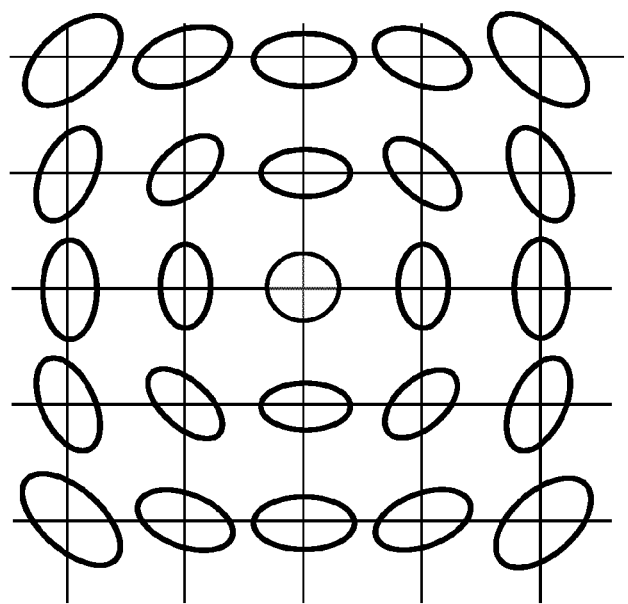
FIGS. 15A and 15B are illustrations showing another example of an astigmatism according to the first embodiment.
Figure 15A:
Figure 15B:
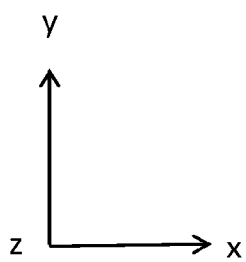
Figure 15B:
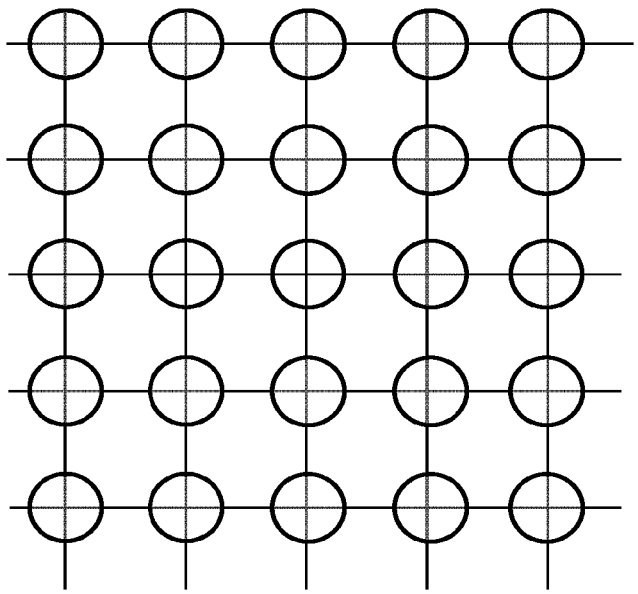

FIGS. 15A and 15B show another example of an astigmatism according to the first embodiment. The direction of the astigmatism occurring in the multiple primary electron beams 20 is not limited to the case of extending radially from the center of the multiple primary electron beams 20 as shown in FIG. 14A. It may extend in the circumferential direction as shown in FIG. 15A. Also in that case, the astigmatism can be similarly corrected as shown in FIG. 15B by correcting the beam trajectory of each beam by using the aberration corrector 220 according to the first embodiment.

Further, the aberration corrector 220 according to the first embodiment can correct a distortion and an astigmatism at the same time. Furthermore, the focus can also be corrected simultaneously by applying the same electric potential (bias potential) to the eight electrodes 16 of the multipole 13.

The electrostatic lens 221 includes electrode substrates arranged in three stages each having an opening through which the whole of the multiple primary electron beams 20 pass. A control potential is applied to the middle electrode substrate. A GND potential is applied to the upper and lower electrode substrates. The focus positions of the multiple primary electron beams 20 can be collectively corrected by adjusting the control potential of the middle electrode substrate. It is also preferable to arrange an electrostatic lens array so that the focus position can be individually controlled for each beam.

The image acquisition mechanism 150 acquires a secondary electron image of a pattern formed on the substrate 101, using the multiple primary electron beams 20 (multiple primary electron beams) whose aberration has been corrected by the aberration corrector 220. Specifically, it operates as follows: Using the multiple primary electron beams 20, the image acquisition mechanism 150 scans the substrate 101 to be inspected on which a figure pattern has been formed, and detects the multiple secondary electron beams 300 emitted from the inspection substrate 101 because of being irradiated with the multiple primary electron beams 20. Detected image data (measured image: secondary electron image: inspection image) based on a detection signal of a secondary electron from each measurement pixel 36 detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed on the substrate 101. Then, for example, when the detected data for one chip 332 has been accumulated, the accumulated data is transmitted as chip pattern data to the comparison circuit 108, together with information data on each position from the position circuit 107.

In a reference image generating step, the reference image generation circuit 112 (reference image generation unit) generates a reference image corresponding to an inspection image to be inspected. The reference image generation circuit 112 generates a reference image, for each frame region, based on design data serving as a basis for forming a pattern on the substrate 101, or on design pattern data defined in exposure image data of a pattern formed on the substrate 101. Preferably, for example, the mask die 33 is used as the frame region. Specifically, it operates as follows: First, design pattern data is read from the storage device 109 through the control computer 110, and each figure pattern defined by the read design pattern data is converted into image data in binary or multiple values.

Here, basic figures defined by the design pattern data are, for example, rectangles and triangles. For example, figure data is stored which defines the shape, size, position, and the like of each pattern figure by using information, such as coordinates (x, y) of the reference position of the figure, lengths of sides of the figure, and a figure code serving as an identifier for identifying the figure type such as rectangles, triangles and the like.

When design pattern data used as the figure data is input to the reference image generation circuit 112, the data is developed/expanded into data for each figure. Then, with respect to each figure data, the figure code, the figure dimensions, and the like indicating the figure shape of each figure data are interpreted. The reference image generation circuit 112 develops each figure data to design pattern image data in binary or multiple values as a pattern to be arranged in squares in units of grids of predetermined quantization dimensions, and outputs the developed data. In other words, the reference image generation circuit 112 reads design data, calculates the occupancy of a figure in the design pattern, for each square region obtained by virtually dividing the inspection region into squares in units of predetermined dimensions, and outputs n-bit occupancy data. For example, it is preferable to set one square as one pixel. Assuming that one pixel has a resolution of $1/2^8$ (=1/256), the occupancy rate in each pixel is calculated by allocating sub regions which correspond to the region of figures arranged in the pixel concerned and each of which corresponds to a 1/256 resolution. Then, the 8-bit occupancy rate data is output to the reference image generation circuit 112. Such square regions (inspection pixels) can be commensurate with pixels of measured data.

Next, the reference image generation circuit 112 performs appropriate filter processing on design image data of a design pattern which is image data of a figure. Since optical image data as a measured image is in the state affected by filtering performed by the optical system, in other words, in an analog state continuously changing, it is possible to match/fit the design image data with the measured data by also applying filtering to the design image data being design side image data whose image intensity (gray scale level) is represented by digital values. The generated image data of a reference image is output to the comparison circuit 108.

Figure 16:
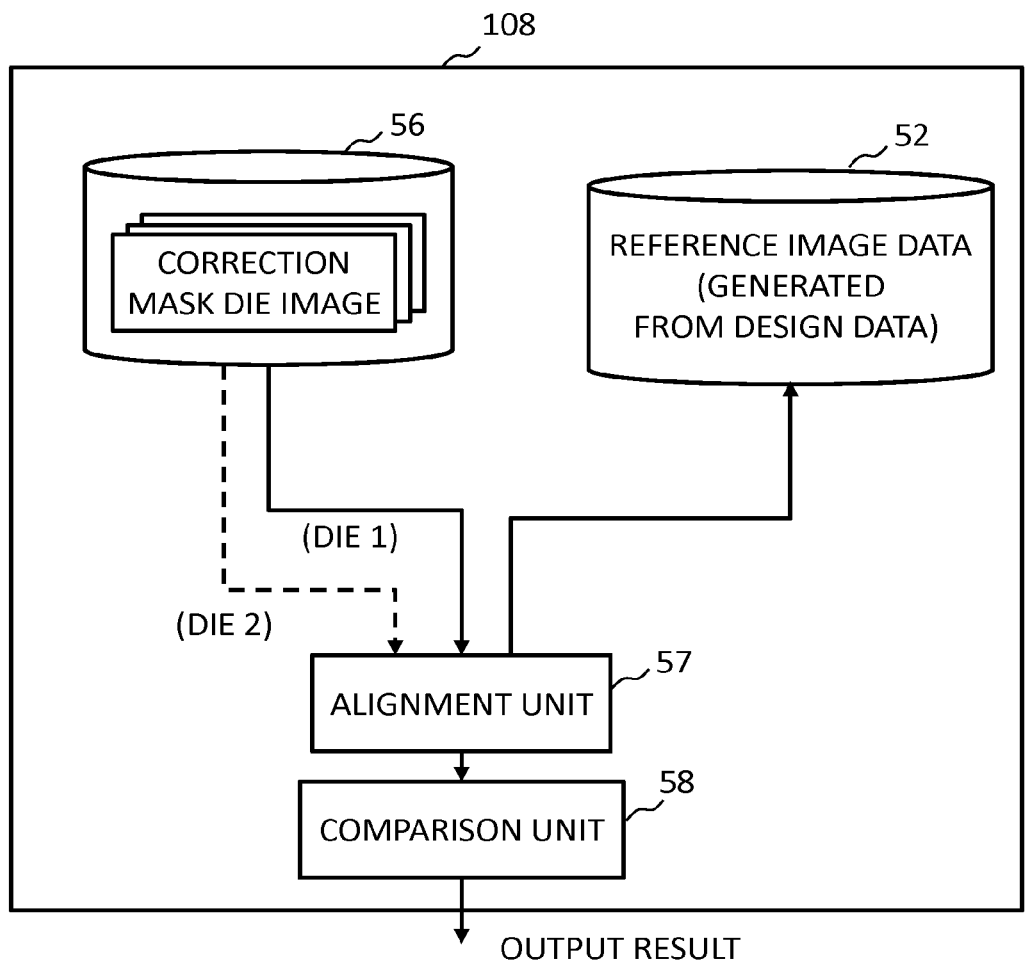
FIG. 16 is a diagram showing an example of an internal configuration of a comparison circuit according to the first embodiment.

FIG. 16 shows an example of an internal configuration of a comparison circuit according to the first embodiment. In FIG. 16, storage devices 52 and 56, such as magnetic disk drives, an alignment unit 57, and a comparison unit 58 are arranged in the comparison circuit 108. Each of the "units" such as the alignment unit 57 and the comparison unit 58 includes processing circuitry. As the processing circuitry, for example, an electric circuit, computer, processor, circuit board, quantum circuit, semiconductor device, or the like can be used. Further, common processing circuitry (the same processing circuitry), or different processing circuitry (separate processing circuitry) may be used for each of the "units". Input data required in the alignment unit 57 and the comparison unit 58, and calculated results are stored in a memory (not shown) or in the memory 118 each time.

In the comparison circuit 108, transmitted pattern image data (or secondary electron image data) is temporarily stored in the storage device 56. Moreover, transmitted reference image data is temporarily stored in the storage device 52.

In an aligning step, the alignment unit 57 reads a mask die image serving as an inspection image, and a reference image corresponding to the mask die image, and provides alignment between the images based on units of sub-pixels smaller than units of pixels 36. For example, the alignment can be performed by a least-square method.

In a comparing step, the comparison unit 58 compares the mask die image (inspection image) and the reference image concerned. The comparison unit 58 compares them, for each pixel 36, based on predetermined determination conditions in order to determine whether there is a defect such as a shape defect. For example, if a difference in gray scale level for each pixel 36 is larger than a determination threshold Th, it is determined that there is a defect. Then, the comparison result is output, and specifically, is output to the storage device 109, the monitor 117, or the memory 118, or alternatively, output from the printer 119.

Although the die-to-database inspection is described above, the die-to-die inspection may also be performed. In the case of conducting the die-to-die inspection, images of the mask dies 33 with identical patterns formed thereon are compared. Accordingly, a mask die image of a partial region of the wafer die 332 serving as a die (1), and a mask die image of a corresponding region of another wafer die 332 serving as a die (2) are used. Alternatively, a mask die image of a partial region of the wafer die 332 serving as a die (1), and a mask die image of another partial region other than the above-mentioned partial region of the same wafer die 332 serving as a die (2), where identical patterns are formed, may be compared. In such a case, if one of the images of the mask dies 33 on which identical patterns are formed is used as a reference image, inspection can be performed by the same method as that of the die-to-database inspection described above.

Thus, in the aligning step, the alignment unit 57 reads the mask die image of the die (1) and the mask die image of the die (2), and provides alignment between the images based on units of sub-pixels smaller than units of pixels 36. For example, the alignment can be performed by a least-square method.

Then, in the comparing step, the comparison unit 58 compares the mask die image of the die (1) and the mask die image of the die (2). The comparison unit 58 compares them, for each pixel 36, based on predetermined determination conditions in order to determine whether there is a defect such as a shape defect. For example, if a difference in gray scale level for each pixel 36 is larger than the determination threshold Th, it is determined that there is a defect. Then, the comparison result is output, and specifically, is output to a storage device, monitor, or memory (which are not shown), or alternatively, is output from a printer.

Regarding the die-to-database inspection and the die-to-die inspection, although comparison is performed for each pixel in the examples described above, it is not limited thereto. For example, it is also preferable to extract the outline (contour) of each figure pattern, and to determine that there is a defect when a distance between the outlines exceeds a threshold.

According to the first embodiment, as described above, the number of power sources used for a multipole array such as the aberration corrector 220 can be reduced.

In the above description, each " . . . circuit" includes processing circuitry. As the processing circuitry, for example, an electric circuit, computer, processor, circuit board, quantum circuit, semiconductor device, or the like can be used. Further, common processing circuitry (the same processing circuitry), or different processing circuitry (separate processing circuitry) may be used for each "circuit". A program for causing a computer to execute processing or the like may be stored in a recording medium, such as a magnetic disk drive, magnetic tape drive, FD, ROM (Read Only Memory), etc. For example, the position circuit 107, the comparison circuit 108, the reference image generation circuit 112, the stage control circuit 114, the aberration correction circuit 121, the lens control circuit 124, the blanking control circuit 126, and the deflection control circuit 128 may be configured by at least one processing circuit described above.

Embodiments have been explained referring to specific examples described above. However, the present invention is not limited to these specific examples. Although FIG. 1 shows the case where the multiple primary electron beams 20 are formed by the shaping aperture array substrate 203 irradiated with one beam from the electron gun 201 serving as an irradiation source, it is not limited thereto. The multiple primary electron beams 20 may be formed by applying a primary electron beam from each of a plurality of irradiation sources.

While the apparatus configuration, control method, and the like not directly necessary for explaining the present invention are not described, some or all of them can be appropriately selected and used on a case-by-case basis when needed.

Further, any aberration corrector and multiple electron beam irradiation apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-electron beam inspection apparatus comprising:
a stage on which a substrate is to be mounted;
an emission source configured to emit multiple primary electron beams;
a multipole array configured to include a plurality of multipoles each of which is arranged at a position, where a corresponding beam of the multiple primary electron beams passes through, to surround the corresponding beam;
an objective deflector configured to scan the substrate with the multiple primary electron beams by performing a collective beam deflection of the multiple primary electron beams having passed through the multipole array;
a plurality of first sample hold circuits, each configured to include a capacitor and a switch arranged for each of electrodes of each of the plurality of multipoles, and to hold, using the capacitor and the switch, a potential to be applied to the each of the electrodes;
a plurality of power sources configured to apply a plurality of potentials to the plurality of first sample hold circuits;
a control circuit configured to control the plurality of first sample hold circuits such that the plurality of potentials having been applied to the plurality of first sample hold circuits are held, in synchronization with swinging back of the collective beam deflection by the objective deflector, by a plurality of second sample hold circuits selected from the plurality of first sample hold circuits; and
a detector configured to detect multiple secondary electron beams emitted because the substrate is irradiated with the multiple primary electron beams.

2. The apparatus according to claim 1, wherein a number of the plurality of power sources is less than a value obtained by multiplying a number of beams of the multiple primary electron beams by a number of electrodes of a multipole for one beam in the plurality of multipoles.

3. The apparatus according to claim 1, wherein a number of the plurality of power sources is less than a number of beams of the multiple primary electron beams.

4. The apparatus according to claim 1, wherein
the control circuit further controls the plurality of power sources,
the objective deflector scans an inside of a desired region for each beam by performing a plurality of line scanning operations by repeating the collective beam deflection, and
the control circuit changes, in synchronization with at least one line scanning operation of the plurality of line scanning operations, each of the plurality of potentials of the plurality of power sources.

5. The apparatus according to claim 1, wherein a number of the plurality of first sample hold circuits is one of greater than and equal to a number obtained by multiplying a number of beams of the multiple primary electron beams by a number of electrodes of a multipole for one beam of the multiple primary electron beams, in the plurality of multipoles.

6. The apparatus according to claim 1, wherein selection of the plurality of second sample hold circuits is changed for the swinging back of the collective beam deflection.

7. A multipole array control method comprising:
applying a plurality of potentials to a plurality of first sample hold circuits each of which holds, using a capacitor and a switch, a potential to be applied to an electrode;
holding, in synchronization with swinging back of a collective beam deflection of multiple primary electron beams by an objective deflector which scans a substrate with the multiple primary electron beams by the collective beam deflection of the multiple primary electron beams, the plurality of potentials having been applied to the plurality of first sample hold circuits, by a plurality of second sample hold circuits selected from the plurality of first sample hold circuits; and
applying the plurality of potentials having been held by the plurality of second sample hold circuits to a plurality of electrodes, which are connected to the plurality of second sample hold circuits, of a plurality of multipoles each of which is arranged at a position, where a corresponding beam of the multiple primary electron beams passes through, to surround the corresponding beam.

8. The method according to claim 7, wherein the plurality of potentials are applied from a plurality of power sources whose number is less than a value obtained by multiplying a number of beams of the multiple primary electron beams by a number of electrodes of a multipole for one beam in the plurality of multipoles, to the plurality of first sample hold circuits.

9. A multi-electron beam inspection method comprising:
emitting multiple primary electron beams;
scanning a substrate placed on a stage with the multiple primary electron beams by using an objective deflector which performs a collective beam deflection of the multiple primary electron beams;
applying a plurality of potentials to a plurality of first sample hold circuits each of which holds, using a capacitor and a switch, a potential to be applied to an electrode;
holding, in synchronization with swinging back of the collective beam deflection of the multiple primary electron beams by the objective deflector, the plurality of potentials having been applied to the plurality of first sample hold circuits, by a plurality of second sample hold circuits selected from the plurality of first sample hold circuits;
applying the plurality of potentials having been held by the plurality of second sample hold circuits to a plurality of electrodes, which are connected to the plurality of second sample hold circuits, of a plurality of multipoles each of which is arranged at a position, where a corresponding beam of the multiple primary electron beams passes through, to surround the corresponding beam;
individually correcting an aberration of each beam of the multiple primary electron beams by a multipole array including the plurality of multipoles;
detecting multiple secondary electron beams emitted because the substrate is irradiated with the multiple primary electron beams; and
comparing a detection image based on a detected detection signal with a reference image, to output a result.

10. The method according to claim 9, wherein the plurality of potentials are applied from a plurality of power sources whose number is less than a value obtained by multiplying a number of beams of the multiple primary electron beams by a number of electrodes of a multipole for one beam in the plurality of multipoles, to the plurality of first sample hold circuits.

11. The apparatus according to claim 1, wherein an irradiation region of the multiple primary electron beams is divided to sub-irradiation regions by a beam pitch size of the multiple primary electron beams, and each beam of the multiple primary electron beams is respectively applied to a same position in any one of the sub-irradiation regions which are different from each other, by performing the collective beam deflection.

* * * * *